(12) United States Patent
Nnebe

(10) Patent No.: US 9,249,315 B2
(45) Date of Patent: Feb. 2, 2016

(54) SELF-ASSEMBLED MONOLAYER RELEASE FILMS

(75) Inventor: Ijeoma M. Nnebe, Ossining, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 140 days.

(21) Appl. No.: 12/543,864

(22) Filed: Aug. 19, 2009

(65) Prior Publication Data

US 2009/0302460 A1 Dec. 10, 2009

Related U.S. Application Data

(62) Division of application No. 11/626,468, filed on Jan. 24, 2007, now abandoned.

(51) Int. Cl.
| | | |
|---|---|---|
| *H01L 21/20* | (2006.01) | |
| *C09D 5/20* | (2006.01) | |
| *H01L 23/42* | (2006.01) | |
| *B05D 1/18* | (2006.01) | |
| *B05D 3/04* | (2006.01) | |
| *B05D 5/08* | (2006.01) | |
| *B05D 7/04* | (2006.01) | |

(52) U.S. Cl.
CPC *C09D 5/20* (2013.01); *H01L 23/42* (2013.01); *B05D 1/185* (2013.01); *B05D 3/0466* (2013.01); *B05D 5/08* (2013.01); *B05D 7/04* (2013.01); *H01L 2924/0002* (2013.01); *H01L 2924/12044* (2013.01); *Y10T 428/15* (2015.01); *Y10T 428/31504* (2015.04)

(58) Field of Classification Search
CPC .................. H01L 2031/0344; H01L 2224/03
USPC ................... 438/99, 496, 763; 257/E21.024
See application file for complete search history.

(56) References Cited

U.S. PATENT DOCUMENTS

| | | | | |
|---|---|---|---|---|
| 4,882,245 | A * | 11/1989 | Gelorme et al. | 430/14 |
| 5,591,789 | A * | 1/1997 | Iruvanti et al. | 523/515 |
| 6,444,496 | B1 * | 9/2002 | Edwards et al. | 438/122 |
| 7,717,693 | B2 * | 5/2010 | Keil et al. | 425/385 |
| 2003/0108727 | A1 * | 6/2003 | Kosaka et al. | 428/207 |
| 2004/0033639 | A1 | 2/2004 | Chinn et al. | |
| 2006/0128142 | A1 | 6/2006 | Whelan et al. | |
| 2006/0273306 | A1 * | 12/2006 | Frechet et al. | 257/40 |
| 2007/0148588 | A1 * | 6/2007 | Park et al. | 430/270.1 |
| 2007/0166557 | A1 * | 7/2007 | Keil et al. | 428/457 |
| 2008/0075885 | A1 | 3/2008 | Nie et al. | |
| 2008/0150148 | A1 | 6/2008 | Frey et al. | |

OTHER PUBLICATIONS

Choi et al., "Properties of Self-Assembled Monolayer as an Anti-adhesion Layer on Metallic Nano Stamper," NSTI-Nanotech 2004, vol. 3, pp. 350-353.*

Tao et al. "HCl Vapor-Induced Structural Rearrangements of n-Alkanoate Self-Assembled Monolayers on Ambient Silver, Copper, and Aluminum Surfaces," J. Am. Chem. Soc., 1996, 118(28), 6724-6735, Jul. 17, 1996.

* cited by examiner

*Primary Examiner* — Julia Slutsker

(74) *Attorney, Agent, or Firm* — Thompson Hine LLP

(57) ABSTRACT

A release film for soft composite materials is provided. The release film contains a film with a closely packed self-assembled monolayer. A method of applying soft composite materials to a substrate without loss of the soft composite material to the release film is also provided. The method is useful in applications such as applying thermal pastes to semiconductor packaging.

8 Claims, 4 Drawing Sheets

SELF-ASSEMBLED MONOLAYER RELEASE FILMS

TECHNICAL FIELD

The disclosure relates to efficient release film coatings for soft composite materials. One embodiment of the disclosure relates to maximal release coatings for thermal paste preforms used in the microelectronics industry.

BACKGROUND

Highly filled granular pastes, comprising metal particles (0.1-100 microns) at a volume percent greater than 65% in an organic binder, are important in a variety of industries including the food, oral care, and microelectronics industries.

In microelectronics these granular pastes often referred to as thermal pastes, play an important role in packaging technology by facilitating heat removal from the chip and accommodating mechanical stresses induced by thermal expansion mismatches between the silicon die and spreader/hat. The proper dispensing of thermal pastes, such that the entire chip area is adequately and homogeneously covered, is a major concern that has been addressed through the formulation of thermal paste preforms. Thermal paste preforms are described in U.S. Pat. No. 6,444,496, which is incorporated herein by reference. These preforms are of size approximately equal to the chip area and are applied to the backside of the chip and compressed between the chip and heat spreader or heat sink to the final desired thickness.

For optimal transfer of these preforms to the backside of the chip, the preforms are prepared on a thin backing material that is 5 mils or less with a typical thickness between about 1 and about 2 mils that facilitates paste peel off with minimal adhesion and release with minimal paste retains. Retained material can result in minor changes in the composition of the preform applied to the die with potentially major changes in its properties such as viscosity and thermal conductivity which are highly sensitive to solids loading for these highly filled granular pastes. The highly filled granular pastes typically have a solids volume fraction greater than about 65%. The retained material can also introduce microscopic roughness in the preform that could serve as sites for air entrapment with subsequent negative impact on paste thermal conductivity and reliability. The ideal properties of the preform backing material therefore include low surface energy, negligible surface roughness, and relatively good thermal stability. Fluoropolymers and polyesters are common polymer films used for release applications. Fluoropolymer films in general have better release properties than polyesters, have good thermal stability, but are more expensive and can have surface roughness on the order of 200 nanometers.

SUMMARY OF THE DISCLOSURE

The disclosure involves a surface modification strategy for preform backing materials to reduce the retained deposit from soft composite materials, such as thermal pastes and other highly-filled pastes of this category, using closely packed self-assembled monolayers. Examples of molecules that can self-assemble to form closely packed layers include but are not limited to alkylphosphonates, alkyl phosphates, alkyl carboxylic acids, alkyl silanes, halogenated silanes, alkyl thiols, alkanethiolates and alkyl disulfides. Specific examples of molecule and substrate combinations include alkyl phosphonates and alkyl phosphates on metal oxides such as alumina and titania, carboxylic acids on metal oxides such as alumina and silver oxide, alkyl silanes and halogenated silanes on silicon and silicone polymer, alkyl methylenes on polymethacrylates and other polymers containing surface hydroxyl functional groups, and alkyl thiols and disulfides on metals such as gold, copper, and platinum. Molecules that form monolayers with a packing density of about 20 Angstroms squared per molecule provide good performance in surface-modified preform backing materials. Such closely packed self-assembled monolayers provide a water contact angle between about 100 to about 140 degrees. Such surfaces are non-wetting to liquids bearing low to moderate surface tension (greater than about 25 milli-Newtons/meter). This includes most organic binders used in thermal pastes, with the exception of low viscosity silicone oils. The mitigation of binder wetting on the surface also reduces particulate deposition because deposition is typically mediated through binder wetting.

For effective peel off, the desired backing material should be a flexible film. Backing material is flexible between about 1 and about 5 mils thick. The typical thickness for the backing material is between about 1 and about 2 mils. The backing material should have a surface roughness between about 10 to about 50 nm. The backing material may be a metal film, a metal film with a metal oxide coatings a metallized polymer film, a metallized polymer film with a metal oxide coating, a polymer film, or a semiconductor film. Metals include aluminum, gold, silver, copper and titanium. Polymeric substrates include polyesters such as Mylar®, polypropylene, polyethylene, polycarbonate, polyethylene naphthalate, polyvinyl chloride, and fluoropolymers. Metal oxides include alumina and titania.

DETAILED DESCRIPTION

Figure 1:
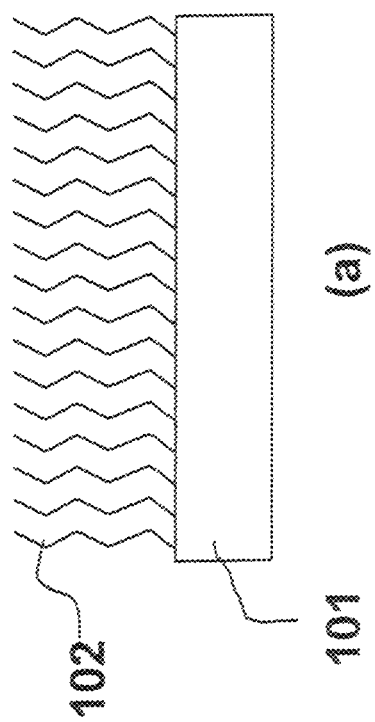
FIG. 1 illustrates a release coating structure for thermal paste preforms.

FIG. 1 illustrates one embodiment of a release coating for thermal paste preforms. Specifically, C10 (10 carbon) or greater molecule chains 102 are end-attached to a substrate 101 at a density ensuring close packing. Typically, C10 to about C30 (30 carbons) molecule chains are end attached to a substrate. The molecules are typically aliphatic. As an example, close packing in self-assembled monolayers occurs when the area per molecule is about 20 Angstroms squared per molecule or an inter-chain distance of 5 Angstroms. This close packing criterion is measured from contact angle measurements, as such surfaces exhibit consistent static water contact angles between about 100 to about 140 degrees as measured via the sessile drop method of contact angle measurement (ASTM D5725-99). The substrate 101 can be a pure metal, metal oxide, semiconductor, or semiconductor oxide film, or a metal-coated polymer of thickness between about 1 and about 5 mil, with a typical thickness between about 1 and about 2 mil. Typically, the substrate is a film where the film is a metal film, a metal film with a metal oxide coating, a metallized polymer film, a metallized polymer film with a metal oxide coating, a polymer film, or a semiconductor film. Specific non-limiting examples of useful substrates include aluminum, gold, titanium, copper or silver sheets (films). In addition, useful substrates include aluminum, gold, titanium, copper or silver coated onto polymer films such as polyester, polypropylene, polyethylene, polycarbonate, polyethylene naphthalate, polyvinyl chloride, and fluoropolymer films. The film may be an aluminized Mylar® film. For metal oxide coated films, the metal oxide coating may be alumina or titania.

Figure 2:
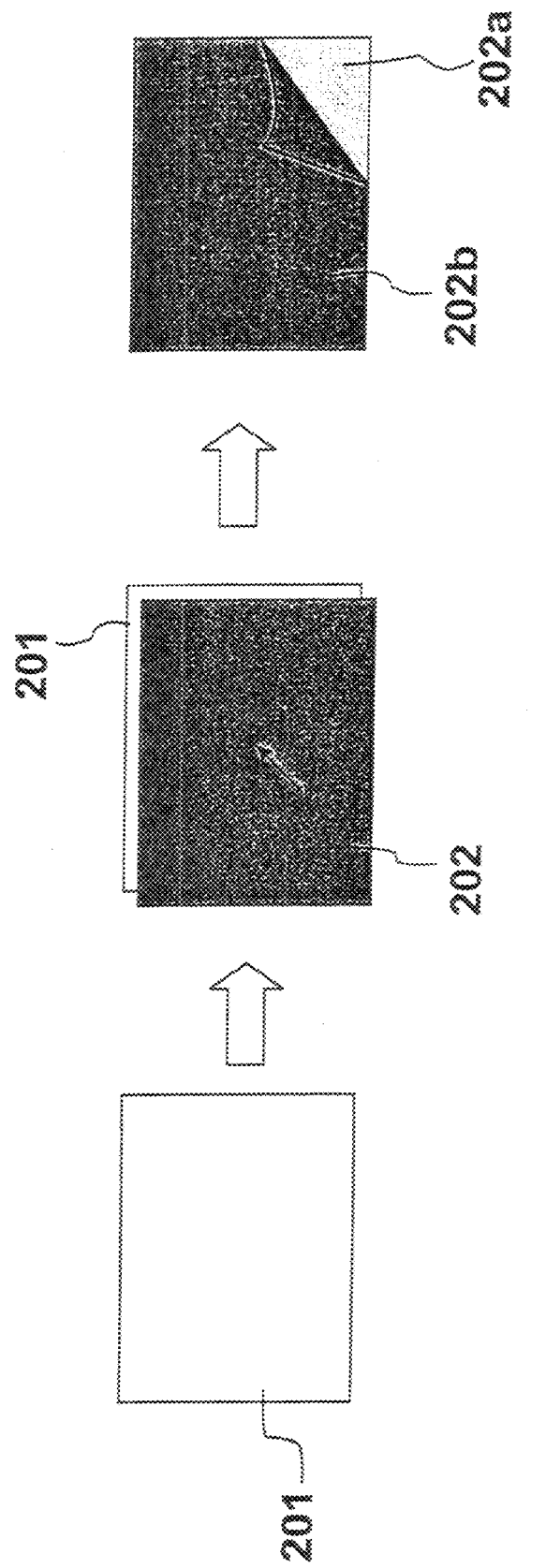
FIG. 2 illustrates a method of transfer of thermal paste preforms to the die surface.

FIG. 2 illustrates a procedure for assembly of thermal paste preforms to the backside of silicon chip 201. The preform mounted on the release film 202 (facing down in image) is aligned with the chip 201 and adequate pressure is applied to ensure adhesion of the preform to the backside of the chip 201. The release film 202b is then peeled off leaving the thermal paste 202a on the backside of the chip. Subsequently, the remaining components of the package (i.e. heat sink and/or spreader) are mounted and the preform is compressed to a desired thickness using the appropriate pressure.

Figure 3:
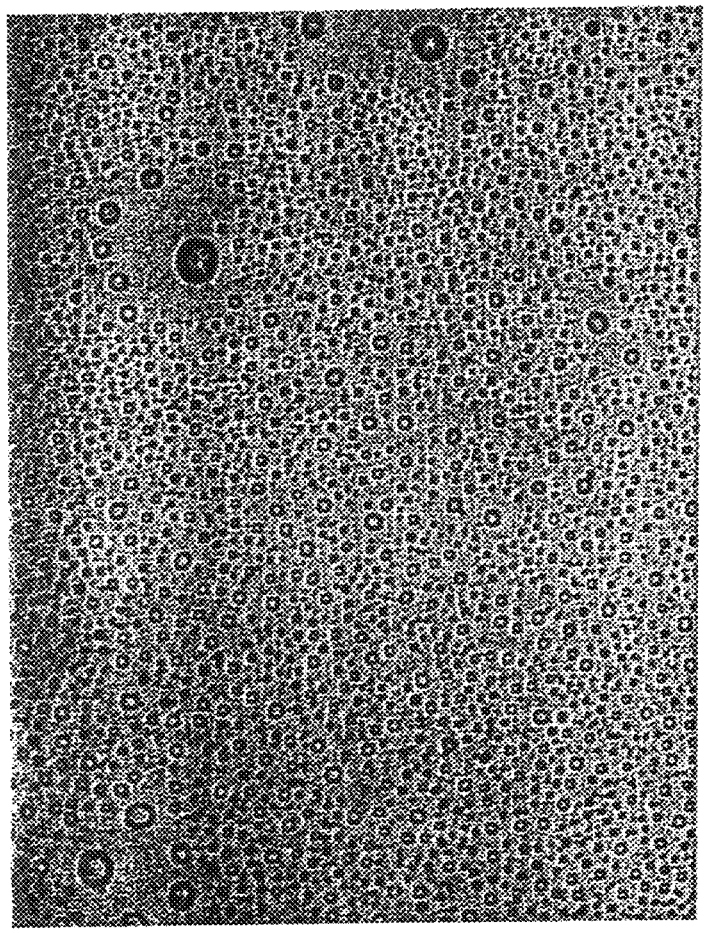
FIG. 3 depicts minimal thermal paste retains classified as good release obtained using a closely packed self-assembled monolayer of decyl phosphonic acid on aluminized Mylar®.

FIG. 3 depicts retains from preform peel-off on the disclosed release coating that disfavors binder wetting. This coating exhibits an average water contact angle of 112 degrees as measured by the sessile drop method described in ASTM D5725-99 (herein incorporated by reference). An example of the preparation of such a coating is provided later. As can be seen in the optical image, no particles are present in the paste retains on the release film. All that is present are microscopic droplets of the binder; due to the unfavorable wetting of the binder on the surface. Note for this example that relatively low pressures are used in the original mounting of the preform onto the release film, however studies using higher pressures show minimal particle deposition. The corresponding amount of binder and particles retained on the release film are not significant and the thermal paste composition is not affected. Furthermore, due to the negligible particulate deposition, the thermal paste interface is likely unperturbed and air entrapment is subsequently unlikely.

Figure 4:
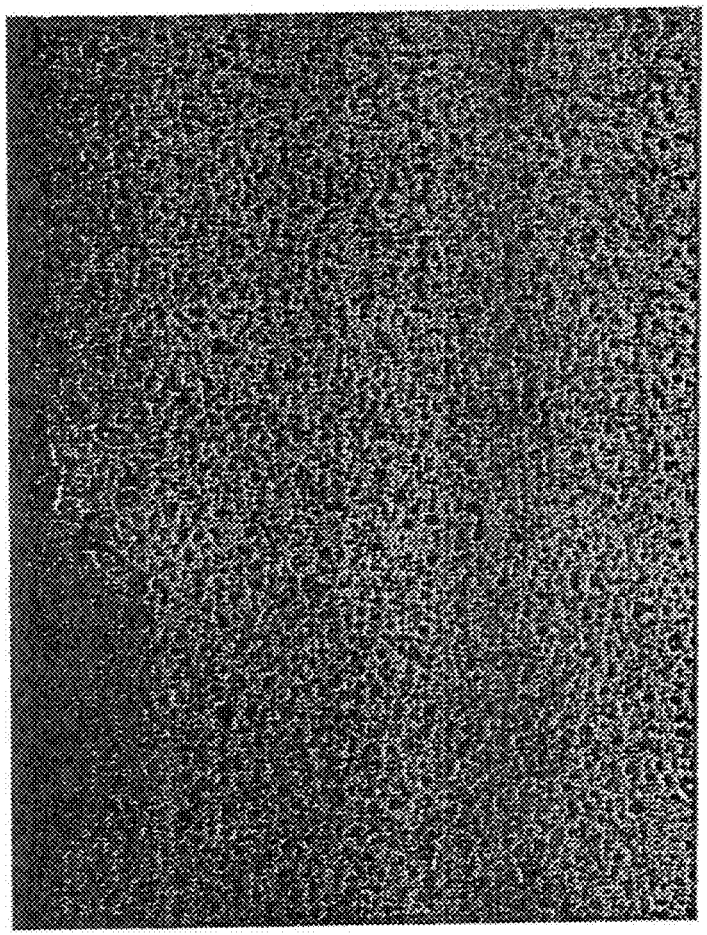
FIG. 4 depicts inadequate release of a thermal paste obtained from a non-closely packed self-assembled monolayer of octadecyltrimethoxysilane on alumlinized Mylar®.

FIG. 4 in contrast depicts paste retains from a non-optimal release coating, here illustrated using a sparsely packed monolayer of aliphatic chains on an aluminized Mylar® backing. In this example, an octadecyltrimethoxysilane monolayer was prepared on aluminized Mylar® using a similar procedure as described later in the detailed example of the preparation of an example release coating This particular molecule does not form a closely-packed monolayer on the substrate indicated by a low water contact angle of 75 degrees (measured by the sessile drop method described in ASTM D5725-996). As is clear from the image, this surface yields significant particulate deposition in paste retains that occurs with the wetting of the binder to the surface. Such a large loss in paste components may affect the composition of the thermal paste (particularly for thermal pastes with multimodal particle size distribution), further affecting its flow or conduction properties. Also of significance is the inclusion of air pockets in the microscopic roughness introduced from the loss of particles at the preform interface that may also affect the paste thermal performance.

One embodiment of the disclosure involves a release coating comprising a closely packed self-assembled monolayer of decyl phosphonic acid on 1.4 mil aluminized Mylar® which forms a release film. This release coating exhibits minimal binder wetting and negligible particulate deposits with an IBM thermal paste preform. The preparation of this coating is described as follows. The aluminized Mylar® (obtained as is from film supplier Griff Paper and Film) is cleaned using UV and ozone for 25 minutes to remove hydrocarbon contaminants from the surface. The aluminized Mylar® is then exposed to a 5 mM solution of decyl phosphonic acid in toluene for 24 hours, followed by several rinses in toluene and a final drying step with nitrogen. Contact angle measurements on the formed release film using the ASTM sessile drop method (ASTM D5725-99) are then used to verify a static contact angle between 100-120 degrees, before the use of the coating as a thermal paste preform backing. This particular preparation describes one example of a closely-packed self-assembled monolayer but many other examples exist including but not limited to dodecylphosphonic acid on aluminized Mylar®, alkanethiolates deposited in ethanol on gold, silver, and copper which exhibit water contact angles between about 100 to about 130 degrees and greater than C15 alkyl carboxylic acids deposited in toluene on aluminum and titanium which exhibit water contact angles between 100 and 120 degrees.

The release film describe above is used to prepare a perform which involves applying a soft composite material to the release film where the monolayer of closely packed self-assembled molecules are between the film and the soft composite material. The soft composite material is typically a thermal paste. Examples of thermal pastes include Arctic Silver, Shinetsu thermal greases, Thermoset greases, IBM Advanced Thermal Compounds, 3M thermal greases.

A semiconductor package is then prepared by aligning the preform described above with at least one chip where the thermal paste faces the backside of the chip, mounting the preform onto the backside of the chip, applying sufficient pressure to the mounted preform to ensure adhesion of the thermal paste to the backside of the chip, peeling the release film of the preform from the thermal paste leaving the thermal paste on the backside of the chip, optionally mounting other components to the semiconductor package and compressing the thermal paste to a thickness with sufficient pressure.

The term "comprising" (and its grammatical variations) as used herein is used in the inclusive sense of "having" or "including" and not in the exclusive sense of "consisting only of". The terms "a" and "the" as used herein are understood to encompass the plural as well as the singular.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The embodiments described hereinabove are further intended to explain best modes known of practicing the invention and to enable others skilled in the art to utilize the disclosure in such, or other embodiments and with the various modification required by the particular applications or uses disclosed herein. Accordingly, the description is not intended to limit the invention to the form disclosed herein. Also, it is intended that the appended claims be construed to include alternative embodiments.

All publications, patents and patent applications cited in this specification are herein incorporated by reference, and for any and all purposes, as if each individual publication, patent or patent application were specifically and individually indicated to be incorporated by reference. In the case of inconsistencies, the present disclosure will prevail.

The invention claimed is:

1. A method for producing a preform comprising:
removing contaminants from a surface of a release film;
said release film is flexible, has a release film surface having a thickness of about 1 mil to 5 mil, a surface roughness of between about 10 and 50 nm, and is selected from the group consisting of aluminum, alumina, gold, silver, copper, titanium, titania, polyethylene terephthalate, polyethylene, polypropylene, polycarbonate, polyethylene naphthalate, polyvinyl chloride;

applying a monolayer of closely packed self-assembled molecules to at least one side of said release film, said self-assembled molecules are selected from the group consisting of alkyl phosphonates, alkyl phosphates, and aliphatic carboxylic acid, and said self-assembled molecules on said release film having a $C_{10}$ to $C_{30}$ carbon chain, said molecules forming said self-assembled monolayer having a packing density of about 20 Å$^2$/molecule, and said closely packed self-assembled monolayer has a water contact angle between about 100° to about 140° as measured by the American Society for Testing and Materials Standard Test D5725-99 sessile drop method of contact angle measurement;

said closely packed self-assembled monolayer has a surface that is non-wetting to liquids bearing a surface tension greater than about 25 milli-Newtons/meter;

applying a soft composite thermal paste to said release film said soft composite thermal paste has a solids volume fraction greater than about 65%, wherein said monolayer of closely packed self-assembled molecules is situated between said release film and said soft composite thermal material paste.

2. The method defined in claim 1 wherein said soft composite thermal paste is selected from the group consisting a silicone-free polysynthetic silver thermal paste containing over 88% thermally conductive filler including micronized silver, sub-micron zinc oxide, a thermally conductive silicone paste having a low molecular weight silicon content of less than 100 ppm, and a thermoset thermally non-reactive, non-silicone conductive grease material blend of conductive fillers in a non-silicone resin system.

3. A preform produced by the method as claimed in claim 1.

4. The method defined in claim 3 wherein said release film is aluminized polyethylene terephthalate and said self-assembled monolayer is decyl phosphonic acid.

5. A method for introducing a said soft composite thermal paste into a semiconductor package comprising aligning said preform as claimed in claim 1 with at least one chip, wherein said soft composite thermal paste faces the backside of said chip;

mounting said preform onto the backside of said chip;
applying sufficient pressure to ensure adhesion of said soft composite thermal paste to the backside of said chip;
peeling said release film of said preform from said soft composite thermal paste, leaving said soft composite thermal paste on the backside of the chip;
optionally mounting other components to the semiconductor package and compressing said soft composite thermal paste to a thickness with sufficient pressure.

6. A semiconductor package produced by the method as claimed in claim 5.

7. The method defined in claim 5 wherein said soft composite thermal paste is selected from the group consisting of a silicone-free polysynthetic silver thermal paste containing over 88% thermally conductive filler including micronized silver, sub-micron zinc oxide, a thermally conductive silicone paste having a low molecular weight silicon content of less than 100 ppm, and a thermoset thermally non-reactive, non-silicone conductive grease material a blend of conductive fillers in a non-silicone resin system.

8. A method for producing a preform comprising:
removing contaminants from a surface of a release film;
said release film is flexible, has a film surface and a thickness of about 1 mil to 5 mil, a surface roughness of between about 10 and 50 nm, and is selected from the group consisting of aluminum, alumina, gold, silver, copper, titanium, titania, polyethylene terephthalate, polyethylene, polypropylene, polycarbonate, polyethylene naphthalate, polyvinyl chloride,
applying a monolayer of closely packed self-assembled molecules to at least one side of said release film,
said self-assembled molecules are decyl phosphonic acid,
said self-assembled molecules on said release film having a $C_{10}$ to $C_{30}$ carbon chain, said molecules forming said monolayer having a packing density of about 20 Å$^2$ per molecule, and said closely packed self-assembled monolayer has a water contact angle between about 100° to about 140° as measured by the American Society for Testing and Materials Standard Test D5725-99 sessile drop method of contact angle measurement,
said surface of said closely packed self-assembled monolayer is non-wetting to liquids bearing a surface tension greater than about 25 milli-Newtons/meter;
applying a soft composite thermal paste to said release film said soft composite thermal paste has a solids volume fraction greater than about 65%, and said soft composite thermal paste is selected from the group consisting of a silicone-free polysynthetic silver thermal paste containing over 88% thermally conductive filler including micronized silver, a thermally conductive silicone paste having a low molecular weight silicon content of less than 100 ppm, and a thermoset thermally non-reactive, non-silicone conductive grease material a blend of conductive fillers in a non-silicone resin system,
wherein said monolayer of closely packed self-assembled molecules is situated between said release film and said soft composite thermal paste.

* * * * *